United States Patent
Schuberth et al.

(10) Patent No.: US 8,767,814 B2
(45) Date of Patent: Jul. 1, 2014

(54) PULSE-WIDTH MODULATOR AND METHODS OF IMPLEMENTING AND USING THE SAME

(75) Inventors: Christian Schuberth, Villach-Landskron (AT); Peter Singerl, Villach (AT); Martin Mataln, Villach (AT)

(73) Assignee: Infineon Technologies AG, Neubiberg (DE)

( * ) Notice: Subject to any disclaimer, the term of this patent is extended or adjusted under 35 U.S.C. 154(b) by 193 days.

(21) Appl. No.: 13/417,000

(22) Filed: Mar. 9, 2012

(65) Prior Publication Data
US 2013/0235923 A1    Sep. 12, 2013

(51) Int. Cl.
H03K 7/08 (2006.01)
(52) U.S. Cl.
USPC .......................... 375/238; 375/295; 332/109
(58) Field of Classification Search
USPC .......... 375/238, 269, 240, 295, 297; 332/106, 332/108, 109, 112
See application file for complete search history.

(56) References Cited

U.S. PATENT DOCUMENTS

| | | | |
|---|---|---|---|
| 5,729,175 A | 3/1998 | Ferrer | |
| 7,453,250 B2 * | 11/2008 | Qiu et al. | 323/288 |
| 2009/0092267 A1 * | 4/2009 | Wu et al. | 381/120 |
| 2009/0180530 A1 * | 7/2009 | Ahn | 375/238 |
| 2010/0054325 A1 | 3/2010 | Sjostrom | |

OTHER PUBLICATIONS

Agrawal, V., et al., "Mutually Disjoint Signals and Probability Calculation in Digital Circuits," IEEE Proceedings of the 8th Great Lakes Symposium on VLSI, Feb. 19-21, 1998, pp. 307-312.
Song, Z., et al., "The Frequency Spectrum of Pulse Width Modulated Signals," Journal of Signal Processing—Special Section: Security of Data Hiding Technologies, vol. 83, No. 10, Aug. 8, 2002, 31 pages.
Guinee, R.A., "A Novel Fourier Series Simulation Tool for Pulsewidth Modulation (PWM) in Pulsed Power Systems," IEEE $22^{nd}$ Symposium on Fusion Engineering, Jun. 17-21, 2007, 4 pages.
Amin, A.M.A., et al., "Exploring Aliasing Distortion Effects on Regularly-Sampled PWM Signals," $3^{rd}$ IEEE Conference on Industrial Electronics and Applications, Jun. 3-5, 2008, pp. 2036-2041.
Gustavsson, U., et al., "A General Method for Passband Quantization Noise Suppression in Pulsed Transmitter Architectures," IEEE MTT-S International Microwave Symposium Digest, Jun. 7-12, 2009, 4 pages.
Chi, S., et al., "The Frequency Spectrum of Polar Modulated PWM Signals and the Image Problem," $17^{th}$ IEEE International Conference on Electronics, Circuits and Systems (ICECS), Dec. 12-15, 2010, pp. 685-688.

* cited by examiner

*Primary Examiner* — Dac Ha
(74) *Attorney, Agent, or Firm* — Slater & Matsil, L.L.P.

(57) ABSTRACT

A pulse-width modulator (PWM) includes a plurality of comparators for comparing an input signal with a plurality of reference signals and for providing a plurality of corresponding comparison signals. The pulse-width modulator also includes a combinational logic for receiving the plurality of comparison signals and for generating a plurality of binary pulse-width modulation signals on the basis of the plurality of comparison signals. At most only a currently selected binary pulse-width modulation signal of the binary pulse-width modulation signals is at a first signal level at a time. The currently selected binary pulse-width modulation signal is associated to a specific reference signal of the plurality of reference signals which is currently closest to the input signal among the plurality of reference signals in terms of a given amplitude relation between the plurality of reference signals and the input signal.

26 Claims, 16 Drawing Sheets

PULSE-WIDTH MODULATOR AND METHODS OF IMPLEMENTING AND USING THE SAME

TECHNICAL FIELD

Embodiments of the present Invention relate to a pulse-width modulator, an amplifier arrangement, a pulse-width modulation transmitter, a method for pulse-width modulation, and a method for transmitting an input signal.

BACKGROUND

In many fields, for example in third and higher generation base stations of mobile communication networks or mobile communication devices, bandwidth-optimized modulation schemes are used for transmitting information. Bandwidth-optimized modulation schemes typically require a non-constant envelope, and thus have a relatively high peak-to-average power ratio (PAR). Linear amplifiers such as class AB amplifiers offer high linearity but must be driven with a high back-off from the maximum (saturated) output power to achieve good linearity across a wide operating range. Typically, RF power amplifiers, of whatever class, e.g., type AB, or so-called switched mode (also: switch mode) amplifiers of type D, E, F, etc. only achieve high efficiency when operated close to their maximum saturated power level. Thus, backing-off a class AB amplifier typically results in lower transmitted power, and thus reduced overall power efficiency.

Instead of using a single amplifier, several individually activatable amplifiers may be used so that for small amplitudes/powers only one or a few amplifiers are active, whereas for large amplitudes/powers more and eventually all amplifiers are used. The outputs of the individual amplifiers are combined by means of a power combining network. The power combining network typically needs be designed carefully to maintain the signal integrity and to achieve a high combining efficiency. Typical combining networks are based on distributed transmission line elements and suffer therefore from bandwidth limitation and cannot be integrated easily on chip level.

SUMMARY OF THE INVENTION

Embodiments of the present invention provide a pulse-width modulator comprising a plurality of comparators and a combinational logic. The plurality of comparators are configured for comparing an input signal with a plurality of reference signals and for providing a plurality of corresponding comparison signals. The combinational logic is configured for receiving the plurality of comparison signals and for generating a plurality of binary pulse-width modulation signals on the basis of the plurality of comparison signals. At most only a currently selected binary pulse-width modulation signal of the binary pulse-width modulation signals is at a first signal level at a time. The currently selected binary pulse-width modulation signal is associated to a specific reference signal of the plurality of reference signals which is currently closest to the input signal among the plurality of reference signals in terms of a given amplitude relation between the plurality of reference signals and the input signal.

A further embodiment provides an amplifier arrangement for amplifying an input signal. The amplifier arrangement comprises a first switch mode amplifier, a second switch mode amplifier, a first power supply for the first switch mode amplifier, a second power supply for the second switch mode amplifier and a pulse-width modulator. The second power supply is configured for producing a different power supply condition than the first power supply. The pulse-width modulator is configured for generating control signals for the first switch mode amplifier and the second switch mode amplifier on the basis of the input signal. The control signals are disjoint signals.

A further embodiment provides a pulse-width modulation transmitter that comprises a multi-level pulse-width modulator and a plurality of switch mode amplifiers. The multi-level pulse-width modulator is configured for generating a plurality of disjoint pulse-width modulation signals on the basis of an input signal of the pulse-width modulation transmitter. The disjoint pulse-width modulation signals indicate an instantaneous amplitude range of an instantaneous amplitude of the input signal. In the plurality of switch mode amplifiers each switch mode amplifier is configured for receiving a corresponding pulse-width modulation signal of the plurality of disjoint pulse-width modulation signals. Thus, at most one of the plurality of switch mode amplifiers is active at a time.

According to further embodiments, a method for pulse-width modulation comprises comparing an input signal with a plurality of reference signals and providing a plurality of corresponding comparison signals. The method further comprises generating a plurality of binary pulse-width modulation signals on the basis of the plurality of comparison signals. At most only a currently selected binary pulse-width modulation signal of the binary pulse-width modulation signals is at a first signal value at a time, wherein the currently selected binary pulse-width modulation signal is associated to a specific reference signal of the plurality of reference signals. The specific reference signal is the reference signal among the plurality of reference signals that currently is closest to the input signal in terms of a given amplitude relation between the plurality of reference signals and the input signal.

A further embodiment provides a method for transmitting an input signal. The method comprises generating a plurality of disjoint pulse-width modulation signals on the basis of the input signal, and providing the plurality of disjoint pulse-width modulation signals to a plurality of switch mode amplifiers. The disjoint pulse-width modulation signals indicate an instantaneous amplitude range of an instantaneous amplitude of the input signal. Each switch mode amplifier is configured for receiving a corresponding pulse-width modulation signal of the plurality of disjoint pulse-width modulation signals so that at most one of the plurality of switch mode amplifiers is active at a time.

BRIEF DESCRIPTION OF THE DRAWINGS

Embodiments of the present invention will be explained below in more detail with reference to the figures, wherein.

DETAILED DESCRIPTION OF ILLUSTRATIVE EMBODIMENTS

Figure 1:
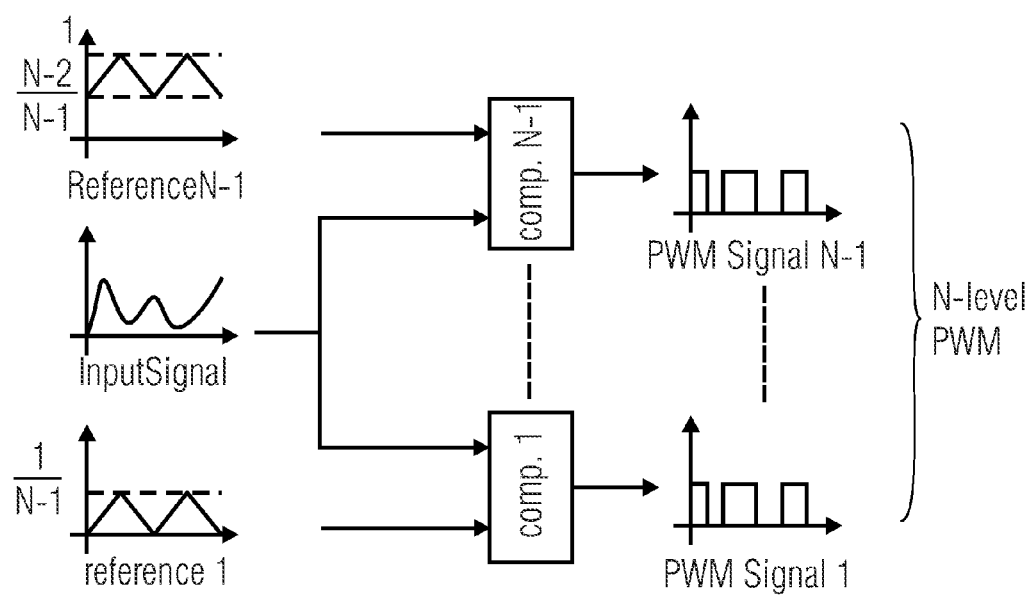
FIG. 1 shows a schematic block diagram of a known analog N-level pulse-width modulator.

Different embodiments of the present invention will subsequently be discussed referring to FIG. 1 to FIG. 5. In advance, identical reference numerals are provided to objects having identical or similar functions so that objects referred to by identical reference numerals within the different embodiments are interchangeable and the description thereof is mutually applicable.

In the following description a system architecture of, e.g., a radio frequency (RF) transmitter, is proposed that enables employing a pulse-width modulation (PWM) method to drive power amplifiers (PA) in a highly efficient way. One of the problems with using pulse-width modulation to drive power amplifiers are the large spectral out-off band components which are located near the desired signal band. These spectral out-off band components typically need to be filtered out before the signal is feed to the antenna to preserve the requirements defined by an applicable telecommunication standard under which the RF transmitter is intended to operate. This is in general a difficult problem because the filtering process can significantly reduce the efficiency of the PA if the reflected out-off band components from the filter are dissipated in an isolator. The efficiency typically may be kept high if the coding efficiency (ratio of inband power to total power) is increased. One option to achieve this is to employ multi-level switch mode power amplifiers (SMPAs) which means that two or more PAs are driven with individual PWM signals where the PA output signals are connected together with a power combiner before the signal is fed to the isolator and filter. This concept works well as long as the PWM frequency can be kept in the few MHz range. However, in future base station applications very high signal bandwidths up to 100 MHz are required, which means that PWM frequencies in the few hundred mega Hertz range are needed to fulfill the linearity requirements. These high frequencies are in general difficult to handle especially on the PA side because of the required high bandwidth matching networks. Additionally the power combing network must be designed carefully to maintain the PWM signal integrity and to achieve a high combing efficiency. Typical combing networks, like a Doherty combiner or a Wilkinson-like in-phase combiner using switches are typically based on distributed transmission line elements and suffer therefore from bandwidth limitation. Furthermore, most power combining networks cannot be integrated easily on chip level.

According to at least some embodiments of the teachings disclosed herein, a PWM coding method may be used in combination with differently sized amplifiers in parallel such that no power combing network is needed while maintaining high efficiency and linearity. Moreover, by increasing the number of amplifiers and proper generation of the PWM signal(s), the efficiency can be increased and adapted to the statistical signal properties of the to-be-transmitted signal (possibly at the expense of circuit complexity). Furthermore, this system architecture allows to reconfigure the transmitter to comply with different communication standards, like GSM (Global System for Mobile Communications) or WCDMA (Wideband Code Division Multiple Access), which makes a step in the direction of a software defined radio approach.

A multi-level PWM scheme may be regarded as a point of origin of the developments leading to the teachings disclosed herein. These preceding developments are illustrated in FIGS. 1 to 5 and described in connection with these figures. The PWM scheme separates the incoming envelope of a complex modulated signal in the amplitude domain by N−1 amplitude and phase shifted triangular reference functions. These reference functions as shown in FIG. 1 (schematic block diagram of an analog N-level pulse-width modulator) are used, e.g., in comparators to generate N−1 individual PWM baseband signals which are used after RF up-conversion to drive the individual PAs in FIG. 2 in a highly efficient way (FIG. 2: schematic block diagram of an analog N-level pulse-width modulator with RF up-converter, PAs and power combiner). After the amplification, the individual RF-bursts (PA output signals) are combined together to build a N-level PWM signal whose out-off band spectral energy becomes lower if the number of levels increases. This increases the overall efficiency of the transmitter for complex modulated signals with high peak to average power ratios (PAPR) even if an isolator is used in front of the required bandpass filter.

Figure 2:
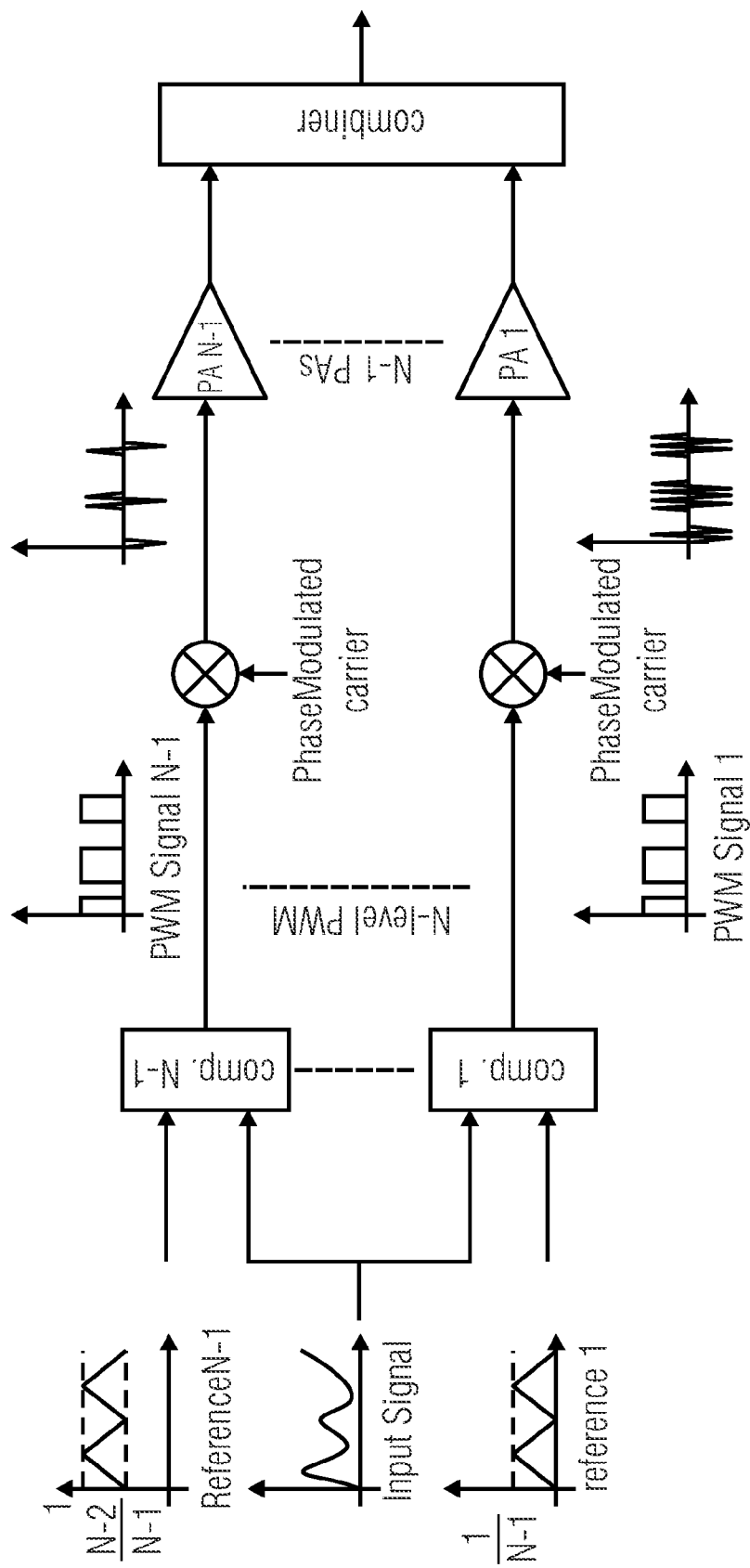
FIG. 2 shows a schematic block diagram of a known transmitter comprising an analog N-level pulse-width modulator.
Figure 3:
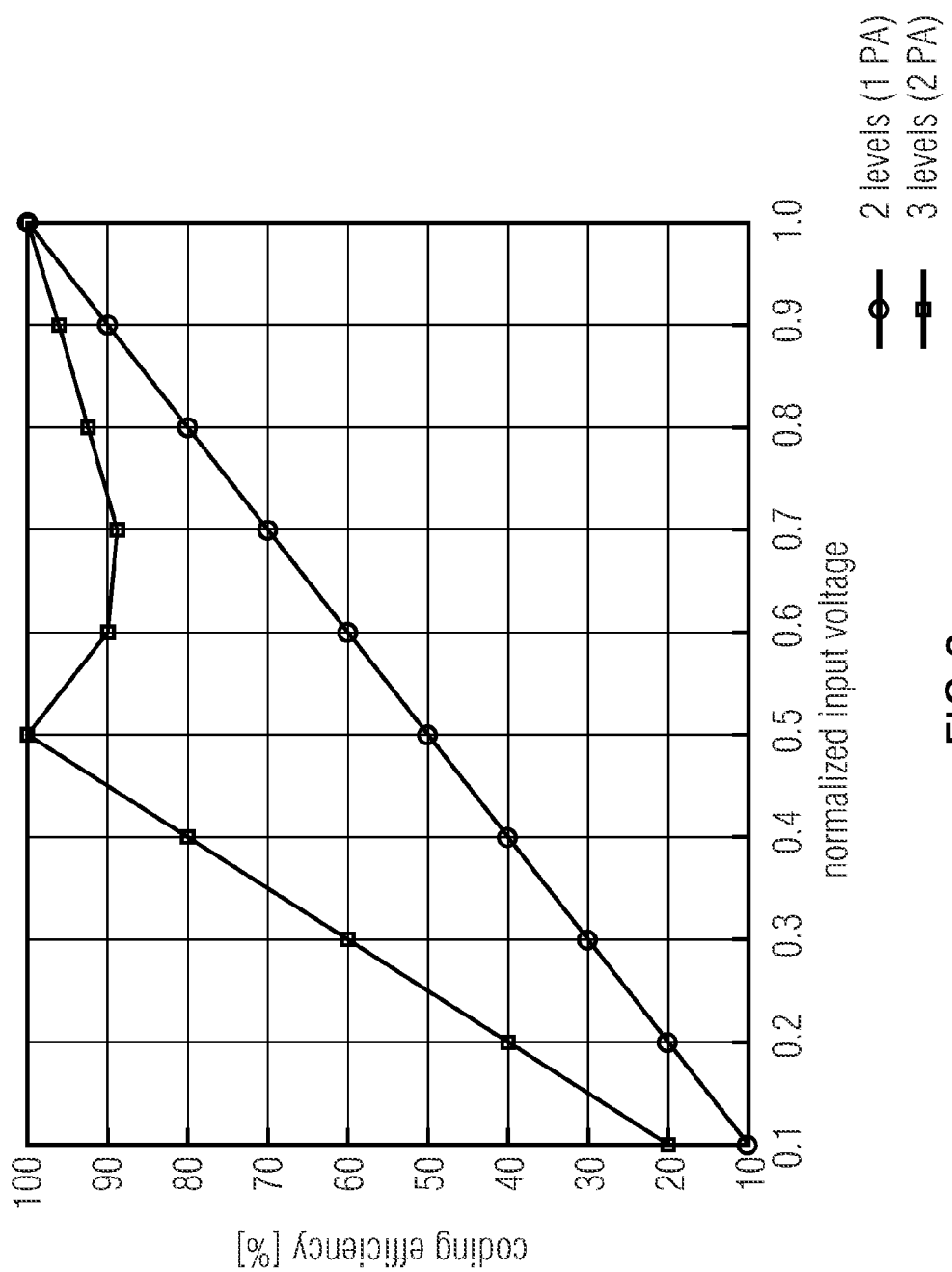
FIG. 3 shows a graph illustrating a comparison of coding efficiencies for two-level and three-level pulse-width modulation schemes in FIGS. 1 and 2.
Figure 4:
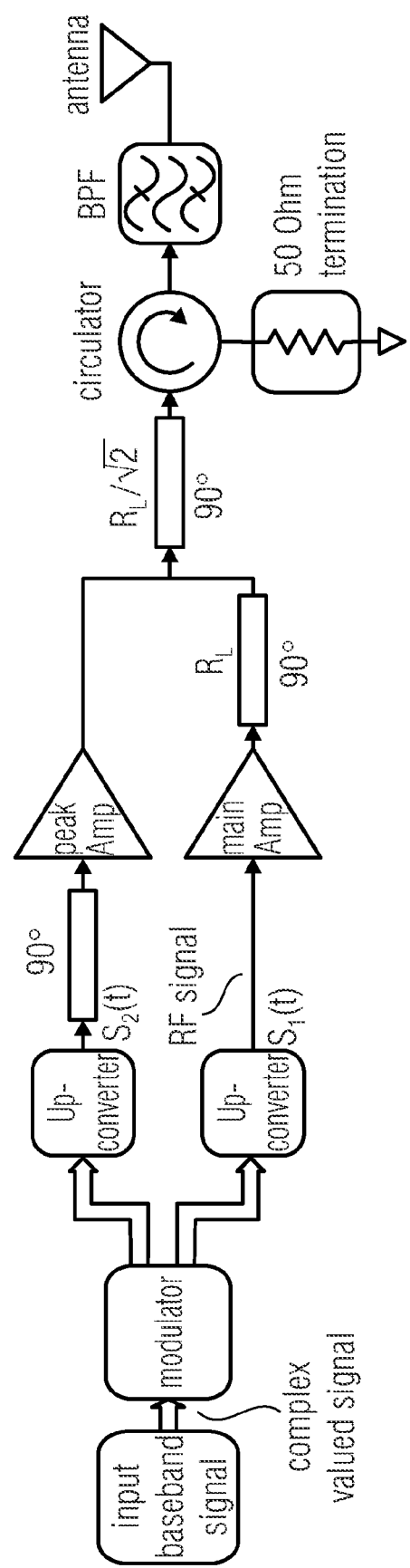
FIG. 4 shows a schematic block diagram of a switched mode transmitter based on three-level PWM with Doherty combiner.
Figure 5:
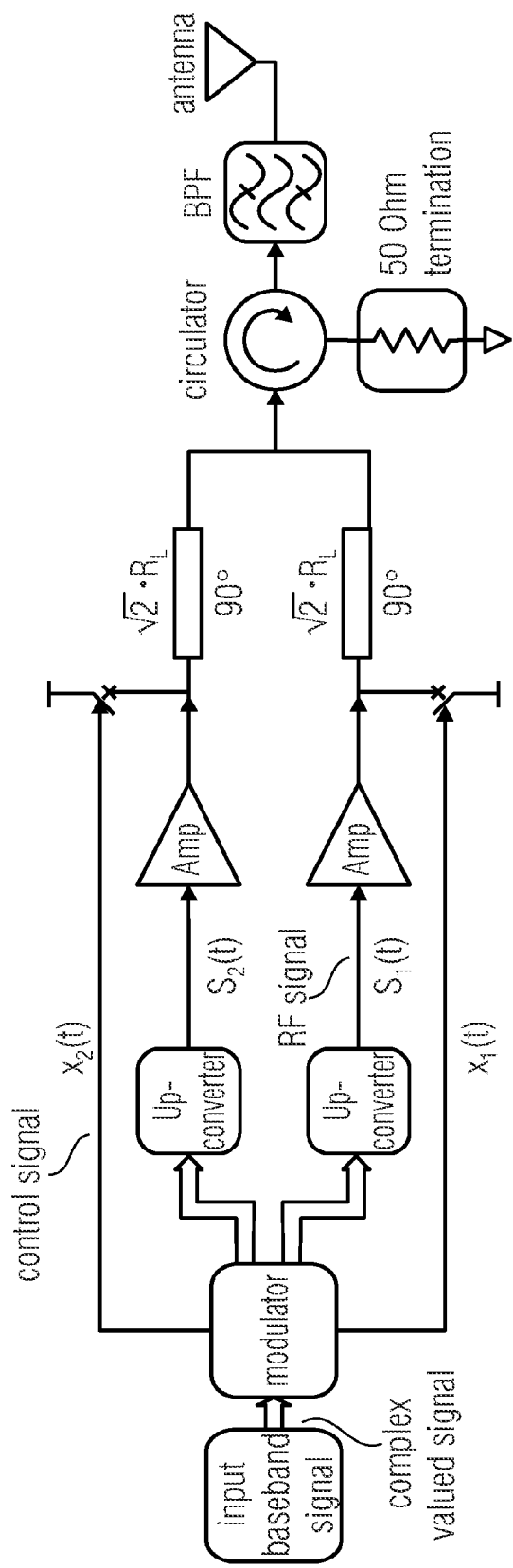
FIG. 5 shows a schematic block diagram of a switched mode transmitter based on three-level PWM with phase separation and Wilkinson-like combiner with switches.

FIG. 3 shows the coding efficiency of the schemes in FIG. 1 and FIG. 2 for two levels (curve with circles; only one PA in FIG. 2) and three levels (curve with squares; two PAs in FIG. 2). While the coding efficiency for a two level PWM scheme decreases linearly with lower input voltage (input signal in FIG. 2), the coding efficiency for the three level PWM stays relatively high down to the half of the maximum input voltage.

This typically leads to a significant improvement in the electrical efficiency for modulated signals with high PAPR. If the number of levels is increased beyond three as shown in FIG. 1 and FIG. 2, the coding efficiency and therefore the electrical efficiency can be further improved at the expense of more hardware effort. To date combiner structures based on, for example, transmission lines like Doherty combiners (see FIG. 4: schematic block diagram of switched mode transmitter based on three-level PWM with Doherty combiner) or Wilkinson-like combiners with switches (see FIG. 5: schematic block diagram of switched mode transmitter based on three-level PWM with phase separation and Wilkinson-like combiner with switches) have been used. Since these structures typically are narrowband and difficult to integrate for common mobile communication standards the useful input signal bandwidth is limited. The architecture in FIG. 2 works fine as long as the input signal bandwidth is not too high (e.g., up to 20 MHz).

Figure 6:
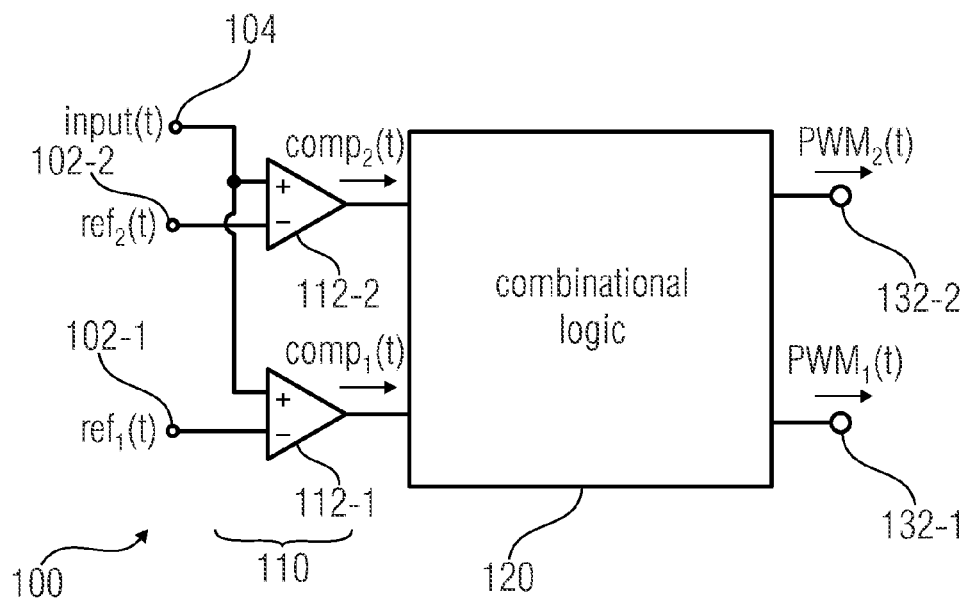
FIG. 6 shows a schematic block diagram of a pulse-width modulator according to at least some embodiments of the teachings disclosed herein.

FIG. 6 shows a schematic block diagram of a pulse-width modulator 100 according to some embodiments of the teachings disclosed herein. The pulse-width modulator 100 is configured to receive an input signal input(t) at an input terminal 104 and to generate, based on the input signal, pulse-width modulated signals $PWM_1(t)$ and $PWM_2(t)$. The pulse-width modulated signals $PWM_1(t)$ and $PWM_2(t)$ are provided at two output ports 132-1 and 132-2, respectively. In general, a pulse-width modulator according to the disclosed teachings may be configured to provide more than two pulse-width modulated signals. As an option, the input signal may be representative of an instantaneous power of a payload signal.

The pulse-width modulator 100 comprises a plurality of comparators 110 and a combinational logic 120. The plurality of comparators 110 comprises a first comparator 112-1 and a second comparator 112-2. The input signal input(t) is fed to each of the comparators 112-1 and 112-2 (e.g., to a non-inverting input of the corresponding comparator, in the case of an operational amplifier-based comparator). Moreover, each comparator 112-1, 112-2 receives an associated reference signal $ref_1(t)$ and $ref_2(t)$, respectively (i.e., comparator 112-1 receives the reference signal $ref_1(t)$ and comparator 112-2 receives the reference signal $ref_2(t)$). The comparator 112-1 generates a comparison signal $comp_1(t)$ which indicates whether the input signal input(t) is currently larger than the reference signal $ref_1(t)$ or smaller. Similarly, the comparator 112-2 generates a comparison signal $comp_2(t)$ which indicates whether the input signal input(t) is currently larger than the reference signal $ref_2(t)$ or smaller. The comparison signals $comp_1(t)$, $comp_2(t)$ form a plurality of comparison signals. In configurations having more than two comparators for comparing the input signal input(t) with a plurality of reference signals $ref_1(t)$, the comparison signals generated by the plurality of comparators may typically form the plurality of comparison signals.

Note that at a given time several of the comparison signals $comp_1(t)$ may be true, i.e. they may be at a first signal value (e.g. logical "1") associated with the Boolean value "true". Let us define that the first signal value ("true" or logical "1") indicates that the input signal input(t) is currently larger than the reference signal $ref_1(t)$ that has been used for the comparison (of course, another definition is also possible). Thus, all those comparison signals $comp_1(t)$ will be at the first signal value for which the associated reference signals $ref_1(t)$ are currently smaller than the input signal input(t).

Referring to the embodiment illustrated in FIG. 6, the plurality of comparison signals $comp_1(t)$, $comp_2(t)$ are provided to the combinational logic 120. The combinational logic 120 is configured for receiving the plurality of comparison signals $comp_1(t)$, $comp_2(t)$ and for generating the plurality of pulse-width modulation signals $PWM_1(t)$, $PWM_2(t)$ on the basis of the plurality of comparison signals. The plurality of pulse-width modulation signals $PWM_1(t)$, $PWM_2(t)$ are mutually exclusive with respect to the first signal value, that is, at most one of the pulse-width modulation signals $PWM_1(t)$, $PWM_2(t)$ may be at the first signal value (e.g., "true") at a time. This concept is also sometimes referred to as "disjoint signals". A distinction may be made between a set of OR-disjoint signals and a set of AND-disjoint signals. According to one definition (proposed by V. D. Agrawal and S. Seth in "Mutually Disjoint Signals and Probability Calculation in Digital Circuits", Proceedings of Great Lakes Symposium on VLSI, 1998, pp. 307 to 312), in a set of OR-disjoint signals, at most one signal can be "true" at any time. According to a related definition, in a set of AND-disjoint signals only one signal can be "false" at any time. In order to identify the pulse-width modulation signal that is currently at the first signal value it is referred to as the "currently selected (binary) pulse-width modulation signal". Each of the pulse-width modulation signals $PWM_1(t)$, $PWM_2(t)$ is associated to one of the plurality of comparison signals $comp_1(t)$, $comp_2(t)$, and, in consequence, to one of the reference signals $ref_1(t)$, $ref_2(t)$. The pulse-width modulation signals $PWM_1(t)$, $PWM_2(t)$ are generated by the combinational logic 120 so that the pulse-width modulation signal which is associated to a specific reference signal $ref_1(t)$ will be the currently selected (binary) pulse-width modulation signal. The mentioned specific reference signal $ref_1(t)$ which is currently closest to the input signal input(t) among the plurality of reference signals in terms of a given amplitude relation. The given amplitude relation may be a smaller-than-relation (or less-than-relation) which means that starting of at a current amplitude of the input signal, it is evaluated which ones of the reference signals are currently smaller than (less than) the input signals, in order to determine a corresponding subset of reference signals that are currently smaller than the input signal. Furthermore, it is evaluated which of the reference signals within the subset is closest to the input signal. In this manner, the next smaller reference signal with respect to the input signal can be determined and the associated pulse-width modulation signal will be the selected pulse-width modulation signal. Of course, the amplitude relation could also be a greater-than-relation (or another relation) so that the next-greater reference signal with respect to the input signal can be determined.

In FIG. 6 the input signal input(t) and the reference signals $ref_1(t)$, $ref_2(t)$ are shown as analog signals and the comparators are shown as analog comparators. However, the input signal and/or the reference signals may be digital signals. In this case the comparators 112-1, 112-2 may be digital comparators. The comparators and/or the combinational logic may be implemented on, for example, a field programmable gate array (FPGA) or a similar device.

According to further embodiments of the teachings disclosed herein, a pulse-width modulator comprises means for comparing an input signal with a plurality of reference signals, means for providing a plurality of corresponding comparison signals, and means for generating a plurality of binary pulse-width modulation signals on the basis of the plurality of comparison signals. At most only a currently selected binary pulse-width modulation signal of the binary pulse-width modulation signals is at a first signal level (e.g. logically "1") at a time, and wherein the currently selected binary pulse-width modulation signal is associated to a specific reference signal of the plurality of reference signals which is currently closest to the input signal among the plurality of reference signals in terms of a given amplitude relation between the plurality of reference signals and the input signal.

Figure 7:
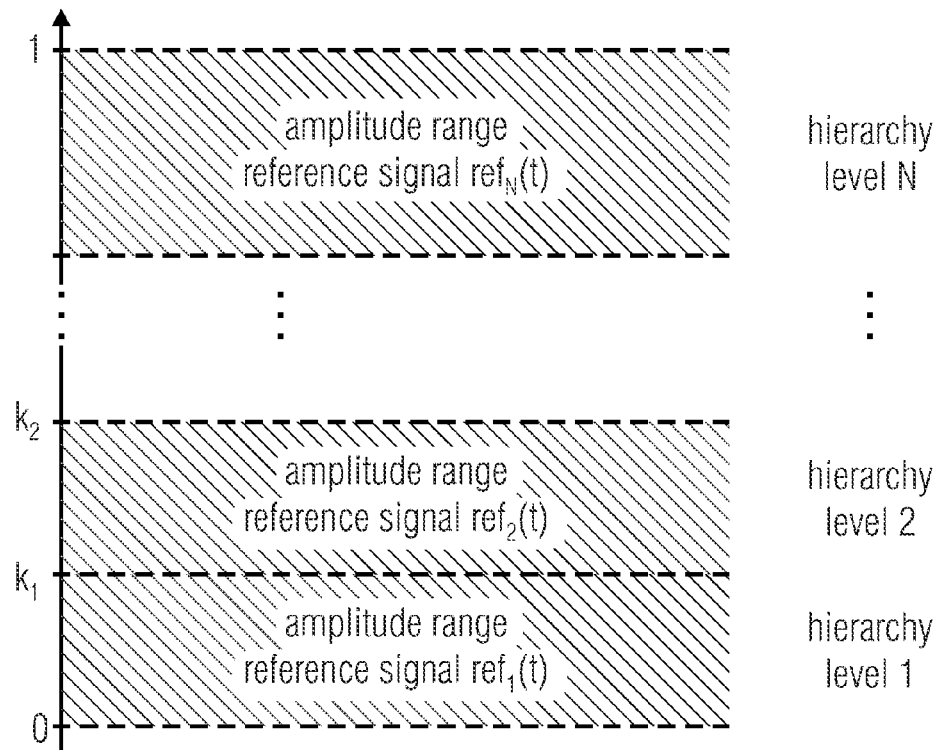
FIG. 7 illustrates an ordering of amplitude ranges of reference signals and corresponding hierarchy levels.

FIG. 7 illustrates amplitude ranges of the reference signals and corresponding hierarchy levels according to some embodiments of the teachings disclosed herein. The reference signals may be time-varying and thus assume different amplitudes at different times. However, according to some embodiments, the reference functions may have amplitude ranges that are disjoint. This means that each reference function $ref_1(t), ref_2(t) \ldots ref_N(t)$ has a dedicated amplitude range which will not be used by the other reference signals. Note that at the boundary between two amplitude ranges a small margin may be provided which may be used be two or more reference signals in order to avoid uncovered amplitude ranges.

The reference signals may be periodically varying, for example in the form of a triangular signal, a saw tooth signal, a stair signal, etc.

Figure 10:
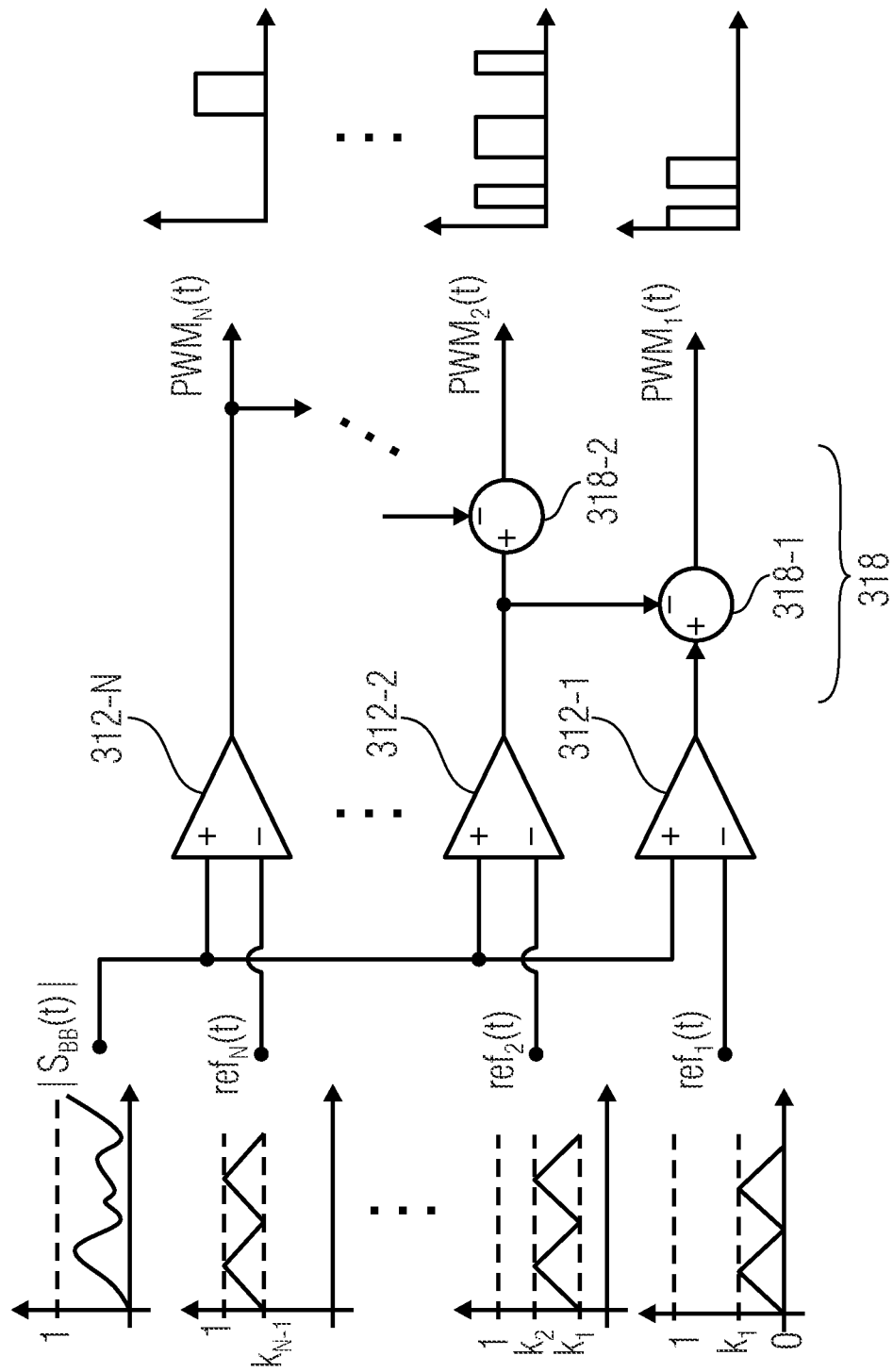
FIG. 10 shows a schematic block diagram of an N-level pulse-width modulator based on triangular functions according to at least some embodiments of the disclosed teachings.

The plurality of reference signals may be ordered according to a hierarchy or an ordering scheme. The order of the reference signals may mean that the amplitudes of the reference signals are ordered so that a reference signal of a higher hierarchy level always has a larger amplitude than a reference signal of a lower hierarchy level, i.e., $ref_i(t) < ref_{i+j}(t)$ for all integers j>0. The combinational logic 120 in the configuration of FIG. 6 may comprise at least one pulse-width modulation signal modifier for conditionally forcing a (binary) pulse-width modulation signal of a first hierarchy level to the second signal value (e.g. logical "0") if a comparison signal of a (next) higher hierarchy level is at the first signal value. If the reference signals are amplitude-ordered all the comparison signals will be true that are associated to reference functions that are currently smaller than the input signal. All the remaining comparison signals will be false. Thus, the plurality of comparison signals is divided into two compact sets: A lower hierarchy set in which all the comparison signals are true and a higher hierarchy set in which all the comparison signals are false (note that this conclusion is based on the above mentioned assumption on the ordering and hierarchy properties of the references signals and the associated comparison signals). A possible implementation of the pulse-width modulation signal modifier is shown in FIG. 10 which will be described below. FIG. 7 illustrates the amplitude ranges for reference signals $ref_1(t), ref_2(t), \ldots ref_N(t)$ and the corresponding hierarchy levels 1, 2, . . . N.

Figure 8:
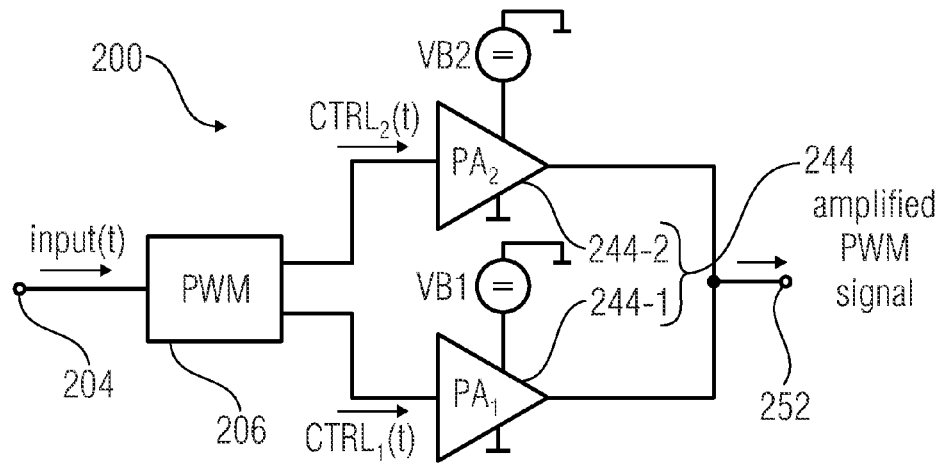
FIG. 8 shows a schematic block diagram of an amplifier arrangement according to at least some embodiments of the teachings disclosed herein.

FIG. 8 shows a schematic block diagram of an amplifier arrangement 200 according to some of the embodiments of the teachings disclosed herein. The amplifier arrangement 200 receives an input signal input(t) at an input terminal 204. The input signal input(t) is processed by a pulse-width modulator 206 of the amplifier arrangement 200. The pulse-width modulator 206 generates two control signals $CTRL_1(t)$ and $CTRL_2(t)$ which are provided to a first amplifier $PA_1$ 244-2 and a second amplifier $PA_2$ 244-2, respectively. The first and second amplifiers 244-1, 244-2 form an amplifier bank 244. In particular, the first and second amplifier 244-1, 244-2 may be switch mode amplifiers. The first amplifier 244-1 is connected to a first power supply VB1 which provides a first power supply condition for the first power amplifier 244-1. The second amplifier 244-2 is connected to a second power supply VB2 which provides a second power supply condition for the second power amplifier 244-2. The second power supply condition is different from the first power supply condition. For example, a bias voltage provided by the second power supply VB2 for the second amplifier 244-2 may be higher than a bias voltage provided by the first power supply VB1 for the first amplifier 244-1.

The outputs of the first and second amplifiers 244-1, 244-2 are connected to each other and form a common output node 252 of the amplifier arrangement 200. An amplified PWM signal is available at the common output node 252. The connection of the outputs of the first and second amplifiers 244-1, 244-2 is possible because of the two amplifiers 244-1, 244-2 at most one amplifier is active at a time. Thus, a power combiner or signal combination network is not needed. The amplifiers 244-1, 244-2 are driven by the pulse-width modulator 206 via the control signals $CTRL_1(t), CTRL_2(t)$ in such a manner that the control signals are disjoint signals. Accordingly, at most one of the control signals $CTRL_1(t), CTRL_2(t)$ may be at the first signal value (e.g. logical "1") which causes the associated amplifier 244-1, 244-2 to become active, i.e., to output a signal.

The two amplifiers 244-1, 244-2 may be differently dimensioned. For example, the first amplifier 244-1 may reach a saturation for smaller amplitudes than the second amplifier 244-2. In connection with the different power supply conditions for the two amplifiers 244-1, 244-2 the more appropriate amplifier may be chosen for obtaining a specific desired output amplitude. The amplifiers 244-1, 244-2 may thus form a scaled amplifier bank.

The pulse-width modulator 206 may be configured in a similar manner as the pulse width modulator 100 shown in FIG. 6. For example, the pulse-width modulator 206 may comprise a plurality of comparators for comparing the input signal with a plurality of reference signals. A plurality of corresponding comparison signals may then be provided by the plurality of comparators. Furthermore, a combinational logic may be provided for generating the control signals $CTRL_1(t), CTRL_2(t)$ on the basis of the plurality of comparison signals. A currently selected control signal is associated to a specific reference signal of the plurality of reference signal. The specific reference signal is currently closest to the input signal among the plurality of reference signals in terms of a given amplitude relation between the plurality of reference signals and the input signal.

According to further embodiments of the teachings disclosed herein, an amplifier arrangement for amplifying an input signal comprises a first means for amplifying a signal using a switch mode amplification scheme, a second means for amplifying a signal using a switch mode amplification scheme, a means for supplying power to the first means for amplifying, a means for supplying power to the second means for amplifying, and a means for generating control signals for the first and second means for amplifying on the basis of the input signal, the control signals being disjoint signals. The second means for supplying power produces a different power supply condition than the first means for supplying power.

The input signal may be a digital signal and the pulse-width modulator 206 may be a digital circuit.

Figure 9:
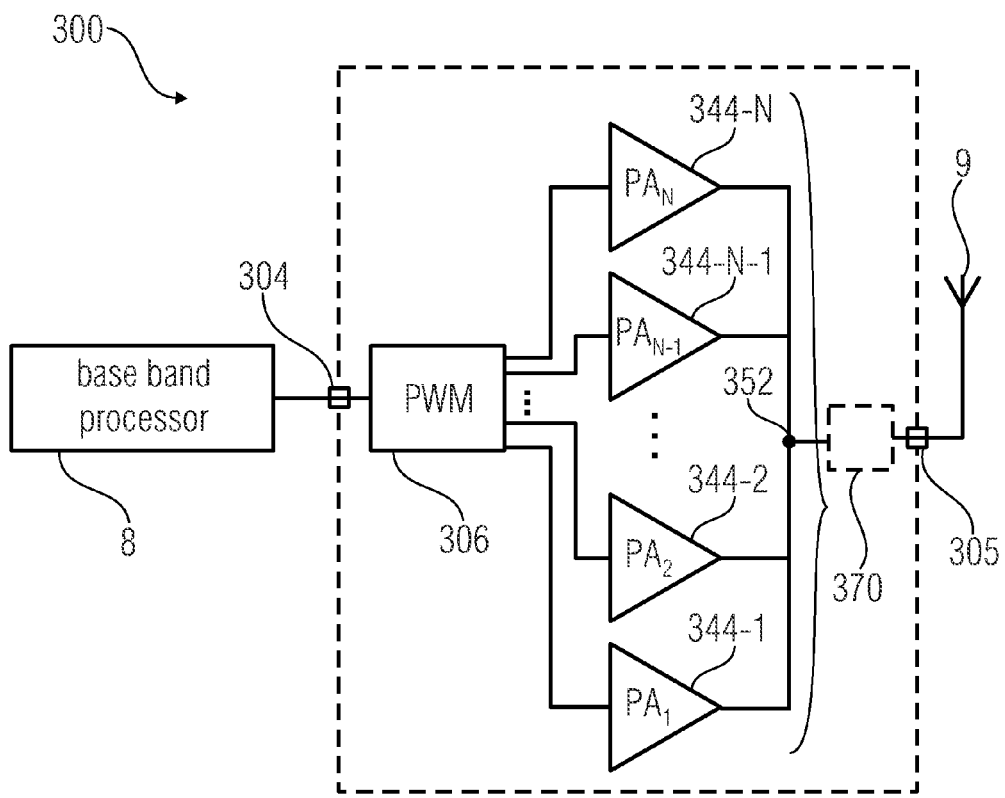
FIG. 9 shows a schematic block diagram of a transmitter according to at least some embodiments of the teachings disclosed herein.

FIG. 9 shows a schematic block diagram of a pulse-width modulation transmitter (PWM transmitter) 300 according to some embodiments of the teachings disclosed herein. The PWM transmitter is illustrated as being connected to a base band processor 8 at an input terminal 304 and to an antenna 9 at an output terminal 305. Nevertheless, the PWM transmitter 300 may also be connected to other devices. In particular, an optical element such as a light emitting diode for optical data transmission may be used instead of the antenna. It is also conceivable to use the PWM transmitter for driving a loudspeaker that is connected to the output terminal 305. The PWM transmitter 300 comprises a pulse-width modulator 306 and a plurality of switch mode amplifiers 344-1, 344-2, ... 344-N−1, 344-N. Optionally, the PWM transmitter 300 comprises an output signal circuit 370 for conditioning the output signal of the PWM transmitter that is provided to the antenna 9. The signal provided from the baseband processor 8 may be an analog signal or a digital signal. Furthermore, the pulse-width modulator 306 may be, at least in part, a digital circuit.

The pulse-width modulator 306 may be multi-level pulse-width modulator for generating a plurality of disjoint pulse-width modulation signals on the basis of the input signal received from the base band processor 8 via the input terminal 304. In the plurality of switch mode amplifiers 344-1, 344-2, ... 344-N−1, 344-N each amplifier may be configured for receiving a corresponding pulse-width modulation signal of the plurality of disjoint pulse-width modulation signals so that at most one of the plurality of switch mode amplifiers is active at a time. At least two of the plurality of amplifiers 344-1, 344-2, ... 344-N−1, 344-N may be dimensioned differently. Typically, all amplifiers 344-1, 344-2, ... 344-N−1, 344-N may be dimensioned differently. Furthermore, at least two of the plurality of switch mode amplifiers may be supplied with different power supply conditions.

The outputs of the amplifiers 344-1, 344-2, ... 344-N−1, 344-N are directly connected to a common node 352 of the PWM transmitter 300. The common node 352 is connected to an input of the (common) output circuit 370.

The output circuit 370 may comprise a directional coupler, a first port of which is connected to the output terminals of the plurality of switch mode amplifiers 344-1, 344-2, ... 344-N−1, 344-N. The output circuit may further comprise a filter connected to a second port of the directional coupler. The filter may be configured to for filtering out-of-band signal components and for passing through in-band signal components. The filtering may involve the filter reflecting the out-of-band signal components back to the directional coupler where they may be dissipated. The directional coupler may be a circulator, for example.

Thus, according to the teachings disclosed herein, a multi-level reconfigurable PWM transmitter concept for highly efficient operation is proposed which can handle high signal bandwidths. The PWM signals are similarly generated as described above (see, for example, FIGS. 1 to 5 and the corresponding description), for example, by comparing the normalized envelope of the baseband signal $|s_{BB}(t)|$ with different reference functions $ref_k(t)$ which is achieved by a plurality of comparators 312-1, 312-2, ... 312-N. For the definition of the reference functions the amplitude interval [0,1] is subdivided into N non-overlapping adjacent sets $[k_n, k_m]$ whereas $1 \leq n$, $m \leq N$ and $0 < k_n < k_m < k_N = 1$. For each of these intervals a reference function, like for example a triangular function, with constant PWM frequency $f_p$ is defined as shown in FIG. 10 which illustrates a schematic block diagram of an N-level pulse-width modulator based on triangular reference functions. These reference functions can then be used in comparators as shown in FIG. 10 to generate the individual PWM signals. Note that the PWM generation is not limited to this scheme. Since the transmitter does not use any power combiners at the output, the multilevel-PWM signal $$PWM_{multi}(t) = \sum_1^N k_l PWM_l(t)$$

is comprised of different amplitude weighted PWM signals $PWM_k(t)$ whereas only one PWM signal is active at a time t. This is accomplished in FIG. 10 by subtracting the according signals. In the configuration shown in FIG. 10 this subtraction of the corresponding signals is performed by a pulse-width modulation signal modifier 318. The pulse-width modulation signal modifier 318 comprises subtractors 318-1, 318-2. The subtractor 318-1 receives the comparison signals generated by the comparator 312-1 and the comparison signal generated by the comparator 312-2. The latter comparison signal (generated by comparator 312-2) is subtracted from the former comparison signal (generated by comparator 312-2). As the reference signals are amplitude-ordered the comparison signal generated by the comparator 312-1 is stochastically dependent on the comparison signal generated by the comparator 312-2. In other words: If the comparison signal (output) of comparator 312-2 is true then the comparison signal (output) of comparator 312-1 must be true, too, because if the input signal $s_{BB}(t)$ is greater than the reference signal $ref_2(t)$, then it surely is greater than the reference signal $ref_1(t)$, as well. Therefore, the possible operations performed by the subtractor 318-1 are:

| Output of comparator 312-1 | Output of comparator 312-2 | Output of subtracter 318-1 |
|---|---|---|
| 1 | 0 | 1 |
| 1 | 1 | 0 |
| 0 | 0 | 0 |

Besides subtractors it is also possible to use NOR-gates or other logic circuits. As mentioned above, the plurality of reference signals may be ordered according to a hierarchy. A first input and a second input of the NOR gate or the subtractor 318-1, 318-2 may then be connected to outputs of a first and second comparator 312-1, 312-2 of adjacent hierarchy levels, respectively.

Figure 11:
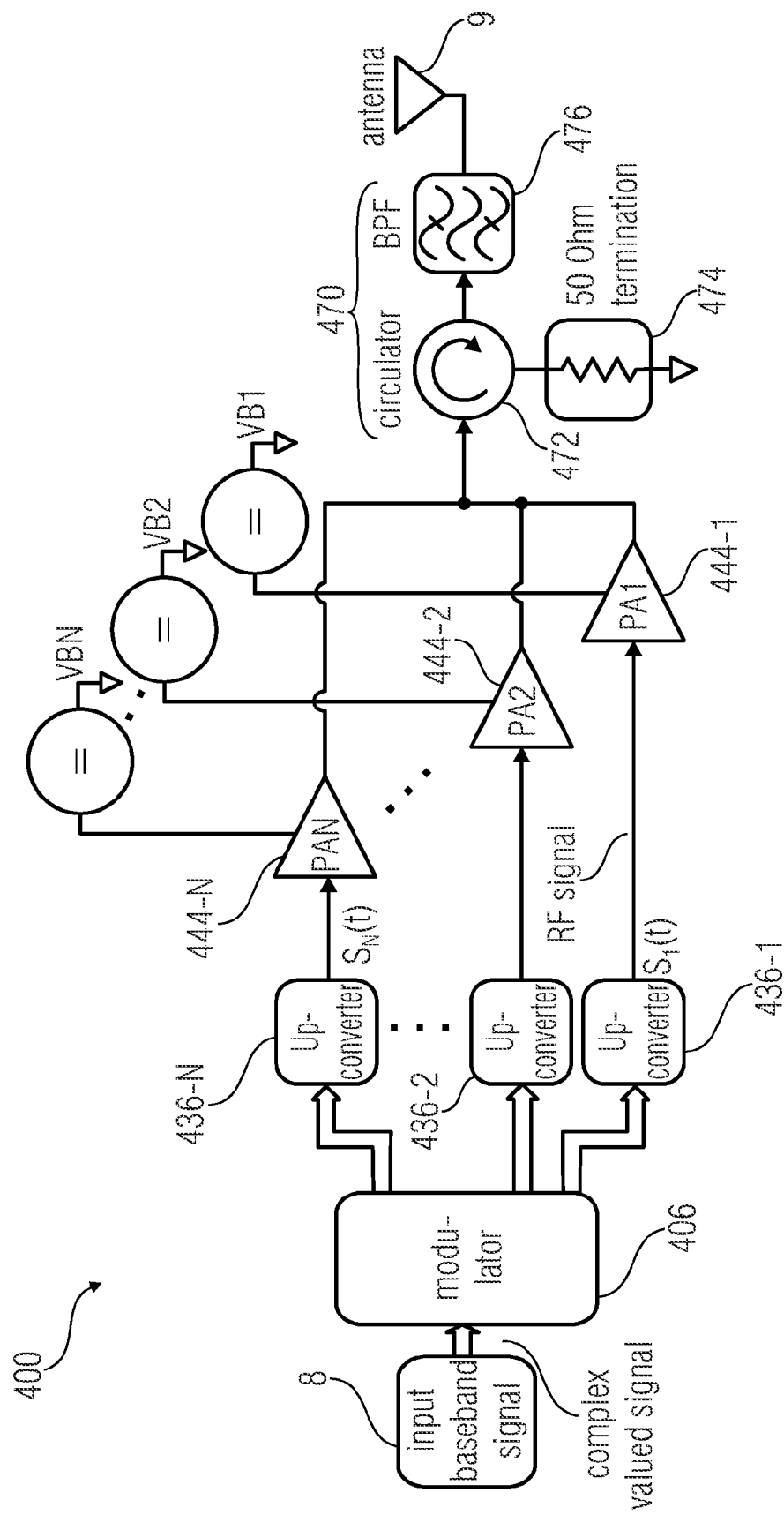
FIG. 11 shows a schematic block diagram of a switched mode transmitter without power combiner according to the disclosed teachings.

The main difference in the multi-level PWM generation in FIG. 10 and FIG. 1 is that the PWM scheme in FIG. 1 produces a thermometer code, which means the higher comparators can only be switched on if the lowers are already on which is not the case in the PWM scheme shown in FIG. 10. Here only one branch is switched on simultaneously. Afterwards the PWM signals $PWM_k(t)$ are up-converted to RF by a phase modulated carrier and upconverters 436-1, 436-2, ... 436-N as depicted in FIG. 11 and fed to different power amplifiers $PA_k$ (444-1, 444-2, ... 444-N). The upconverters 436-1, 436-2, ... 436-N generate burst modulated signals $s1(t)$, $s2(t)$, ... $sN(t)$.

In particular, FIG. 11 shows a schematic block diagram of a Switched mode transmitter 400 without power combiner. The switched mode transmitter 400 is connected to a baseband processor 8 at an input side and to an antenna 9 at an output side. The input baseband signal is a complex valued signal which is pulse-width modulated by means of a modulator 406. The modulator 406 provides a plurality of PWM signals to the upconverters 436-1, ... 436-N. Each PWM is upconverted by one of the upconverters 436-1, ... 436-N so that a plurality of RF signals is obtained. The RF signals are then provided to the power amplifiers 444-1, ... 444-N. Each amplifier has its own power supply VB 1, VB2, ... VBN. The output terminals of the amplifiers 444-1, . . . 444-N are connected to a common node 452. An output circuit 470 is also connected to the common node 452. The output circuit 470 comprises a circulator 472, a 50 ohm termination 474, and a bandpass filter 476. The antenna is connected to an output of the bandpass filter 476.

To reconstruct the multilevel signal and maintain linearity each of the burst modulated signals $s_1(t)$, $s_2(t)$, ... $s_N(t)$ is weighted with the corresponding factor $k_1$, $k_2$, ... $k_N$ by the different PAs 444-1, ... 444-N. Because high efficient operation of a power amplifier is only achieved when the amplifier is driven close to saturation, the transistor periphery and the supply voltage for each power amplifier 444-1, ... 444-N needs to be adapted for each signal $s_1(t)$, ... $s_N(t)$. Since the driving signal $s_N(t)$ contributes with a amplitude weight $k_N=1$, the amplifier PAN (444-N) outputs maximum voltage swing $v_{max}$ and output power when driven in saturation and therefore utilizes the largest transistor periphery $w_N=1_{max}$ and highest supply voltage $VBN=VB_{max}$. Because all amplifiers operate in parallel in the same load $R_L$ (only one out of N amplifiers is active simultaneously) and each amplifier needs to contribute with different voltage swings to form the multi-level PWM signal, the supply voltage $VB_j=k_j*VB_{max}$ of each PA may be scaled based on the modulation thresholds $k_j$. Additionally the periphery of the transistor $w_j=k_j*1_{max}$ may be adapted when driving each amplifier with signals with equal maximum input voltage swing $max(s_N(t))=max(s_1(t))$ or the driving level of the PAs has to be reduced when the periphery $w_j=1_{max}$ is kept constant.

Figure 12:
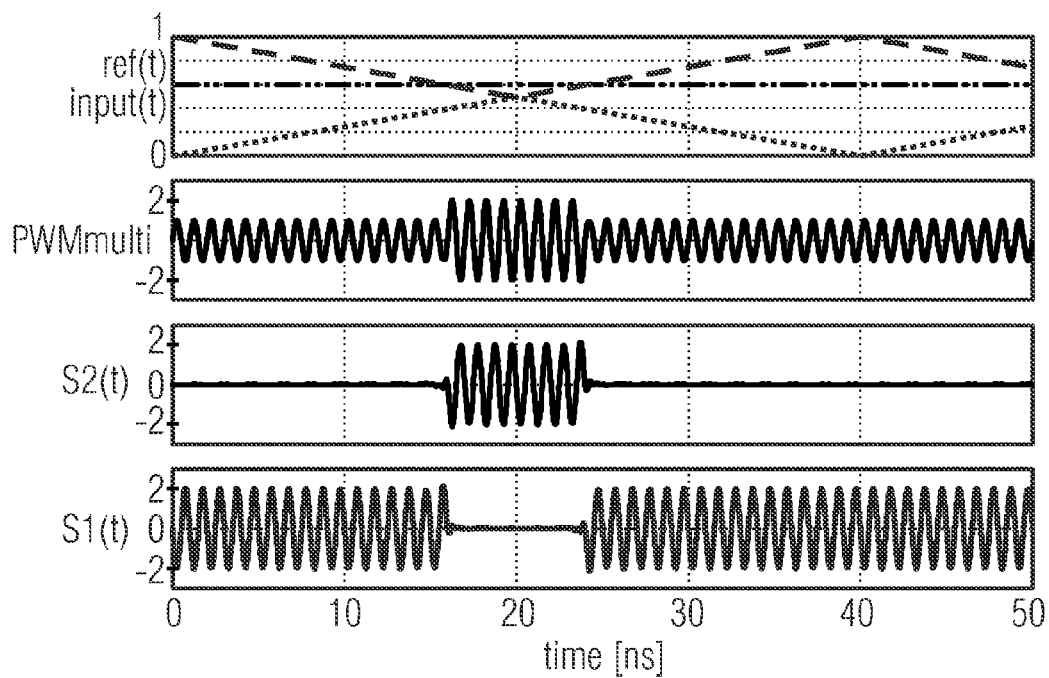
FIG. 12 illustrates time domain signals for a N=2 multi-level pulse width modulation scheme according to the disclosed teachings.
Figure 14:
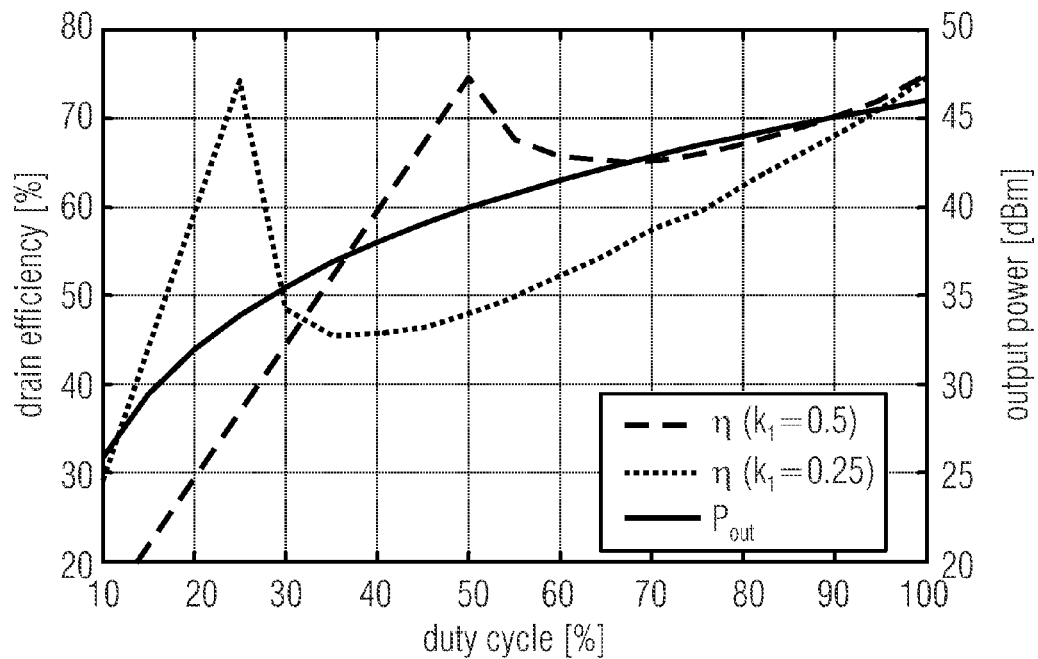
FIG. 14 shows a graph illustrating an efficiency and an output power as function of a duty cycle of a N=2 multi-level pulse-width modulation scheme for different sets of modulator threshold values.

As an example, FIG. 12 shows the time domain signals for a N=2 multi-level transmitter with a modulation threshold $k_1$ set to 0.5. In particular, FIG. 12 illustrates time domain signals, for a N=2 multi-level PWM signal with a constant normalized input signal $|s_{BB}(t)|=0.6$, of the reference functions $ref_k(t)$ for modulator threshold value $k_1=0.5$, the up-converted RF burst $s_1(t)$, and the corresponding multi-level PWM signal PWMmulti(t). In this graph the triangular reference functions and a constant input level signal is shown. Based on the schematic shown in FIG. 10 the corresponding driving signals for each PA is generated. Please note that only one PA is driven at a time. Since the PA is either driven into saturation or switched off the PA operates in a highly efficient mode. FIG. 14 shows the drain efficiency and output power as function of the duty cycle or the normalized input magnitude $|s_{BB}(t)|$, respectively.

Figure 13:
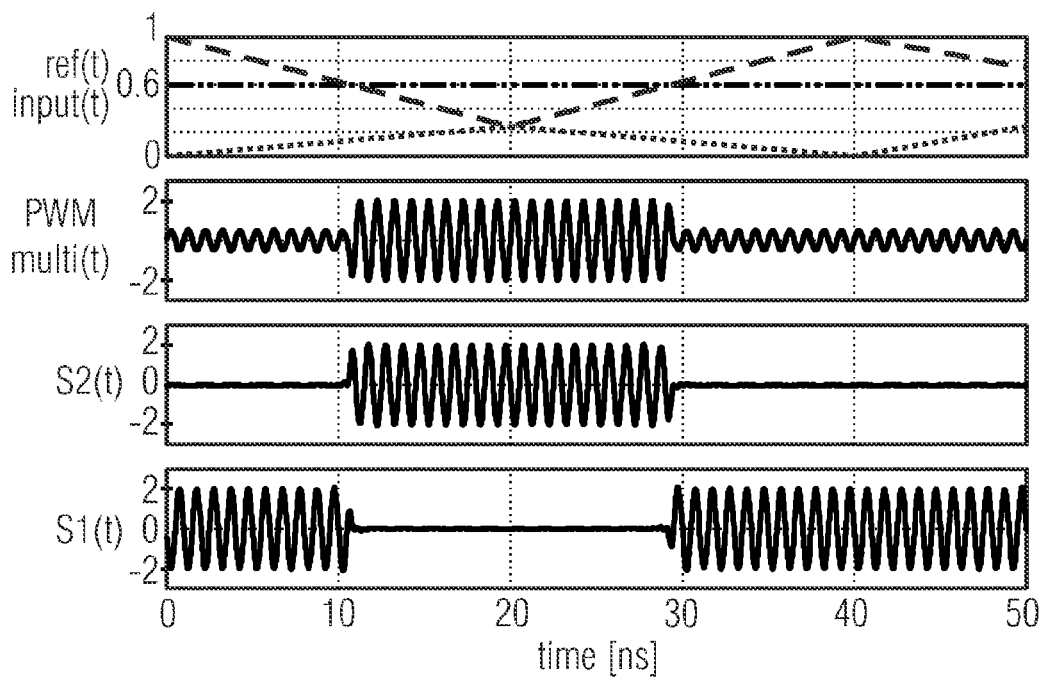
FIG. 13 illustrates time domain signals for a N=2 multi-level pulse width modulation scheme similar to FIG. 12 but with a different choice of reference functions.
Figure 15:
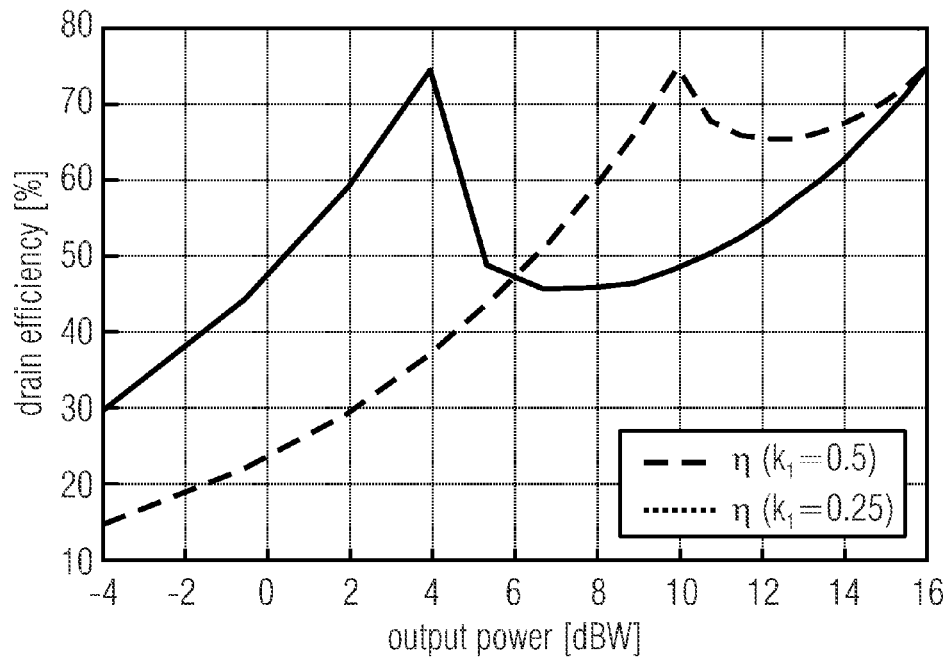
FIG. 15 shows a graph illustrating an efficiency as function of output power of a N=2 multi-level pulse-width modulation scheme for different sets of modulator threshold values.

Since the average efficiency of a modulated signal depends on the probability density function (pdf) of the instantaneous signal magnitude it is important to achieve high drain efficiency over the whole dynamic input voltage range. To gain a better average efficiency with the proposed transmitter architecture it is possible to design the transmitter by changing the modulation thresholds $k_j$ to match the efficiency characteristic to the probability density function of the input signal. In FIG. 13 the driving signals are shown for a modulation threshold $k_1=0.25$, whereas in FIG. 14 the effect on the drain characteristic is clearly shown (caption of FIG. 13: Time domain signals, for a N=2 multi-level PWM signal with a constant normalized input signal $|s_{BB}(t)|=0.6$, of the reference functions $ref_k(t)$ for modulator threshold value $k_1=0.25$, the up-converted RF bursts $s_1(t)$, and the corresponding multi-level PWM signal PWMmulti(t); caption of FIG. 14: Efficiency and output power as function of the duty-cycle of a typical N=2 multi-level Class-B PA with different set of modulator threshold values $k_1$ as shown in FIG. 11). Depending on the peak to average power ratio (PAPR) the drain efficiency can be shaped, like shown in FIG. 15, which shows an efficiency as function of output power of a typical N=2 multi-level Class-B PA with different set of modulator threshold values $k_1$ as shown in FIG. 11. The second efficiency peak is shifted from 6 dB below peak power to 12 dB below peak power depending on the modulation threshold. Even if the device size is kept constant after an initial design $(k_n)$ the transmitter can be later reconfigured by changing only the modulation threshold $(k_n < k_m)$, the supply voltages, and the maximum magnitude of the RF bursts driving the amplifiers.

Figure 16:
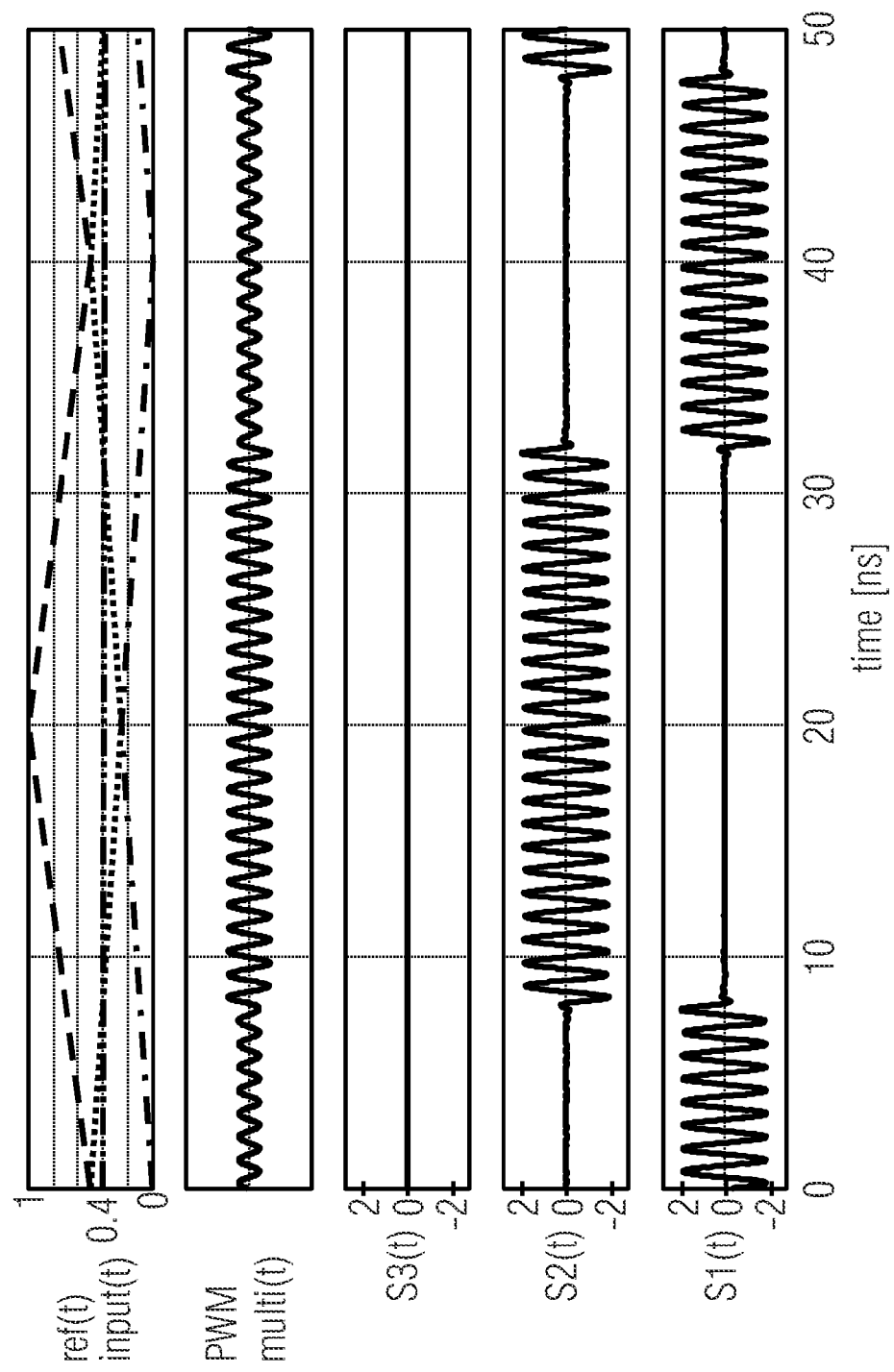
FIG. 16 illustrates time domain signals for a N=3 multi-level pulse width modulation scheme according to the disclosed teachings.

FIG. 16 illustrates time domain signals, for a N=3 multi-level PWM signal with a constant normalized input signal $|s_{BB}(t)|=0.4$, of the reference functions $ref_k(t)$ for modulator threshold values $k_1=0.25$ and $k_2=0.5$, the up-converted RF burst $s_1(t)$, $s_2(t)$, $s_3(t)$, and the corresponding multi-level PWM signal PWMmulti(t).

Figure 17:
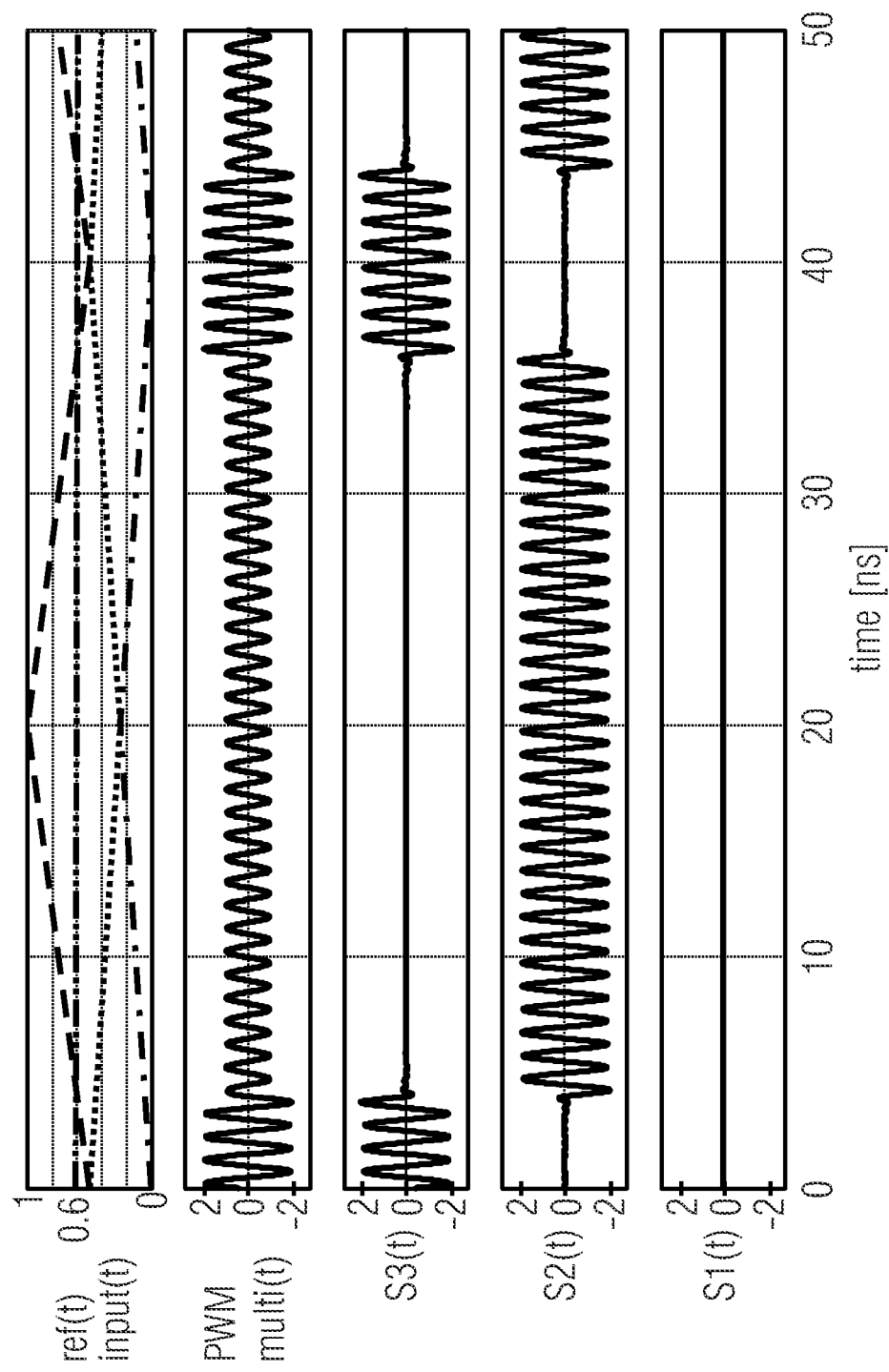
FIG. 17 illustrates time domain signals for a N=3 multi-level pulse width modulation scheme similar to FIG. 16 but for a different input signal.

FIG. 17 illustrates time domain signals, for a N=3 multi-level PWM signal with a constant normalized input signal $|s_{BB}(t)|=0.6$, of the reference functions $ref_k(t)$ for modulator threshold values $k_1=0.25$ and $k_2=0.5$, the up-converted RF burst, $s_1(t)$, $s_2(t)$, $s_3(t)$, and the corresponding multi-level PWM signal PWMmulti(t).

Figure 18:
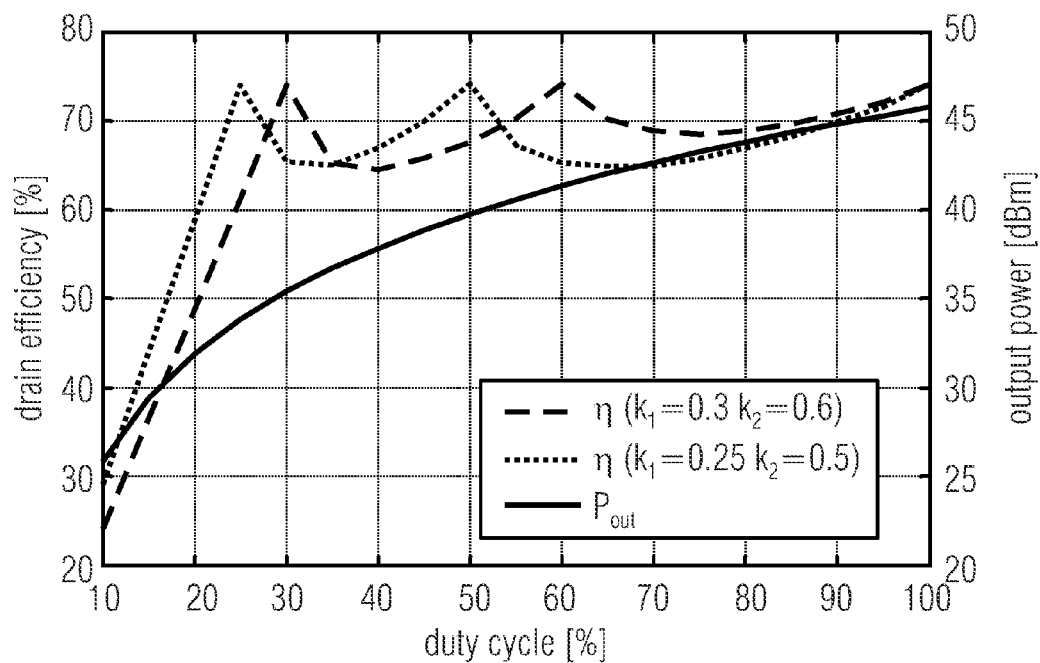
FIG. 18 shows a graph of efficiency and output power as function of the duty cycle of a N=3 multi-level pulse-width modulation scheme for different sets of modulator threshold values.

FIG. 18 shows a graph illustrating the efficiency and the output power as function of the duty-cycle of a typical N=3 multi-level Class-B PA with different set of modulator threshold values $k_1$ and $k_2$ as shown in FIG. 11.

Figure 19:
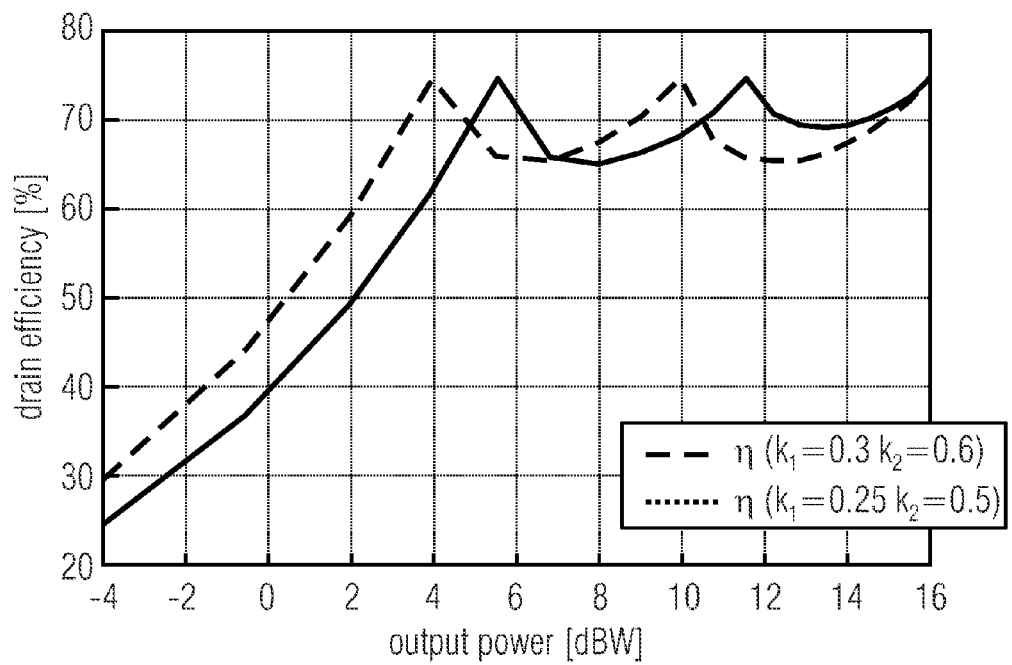
FIG. 19 shows a graph of efficiency as function of output power of a N=3 multi-level pulse-width modulation scheme for different sets of modulator threshold values.

FIG. 19 shows a graph illustrating the efficiency as function of output power of a typical N=3 multi-level Class-B PA with different set of modulator threshold values $k_1$ and $k_2$ as shown in FIG. 11.

Figure 20:
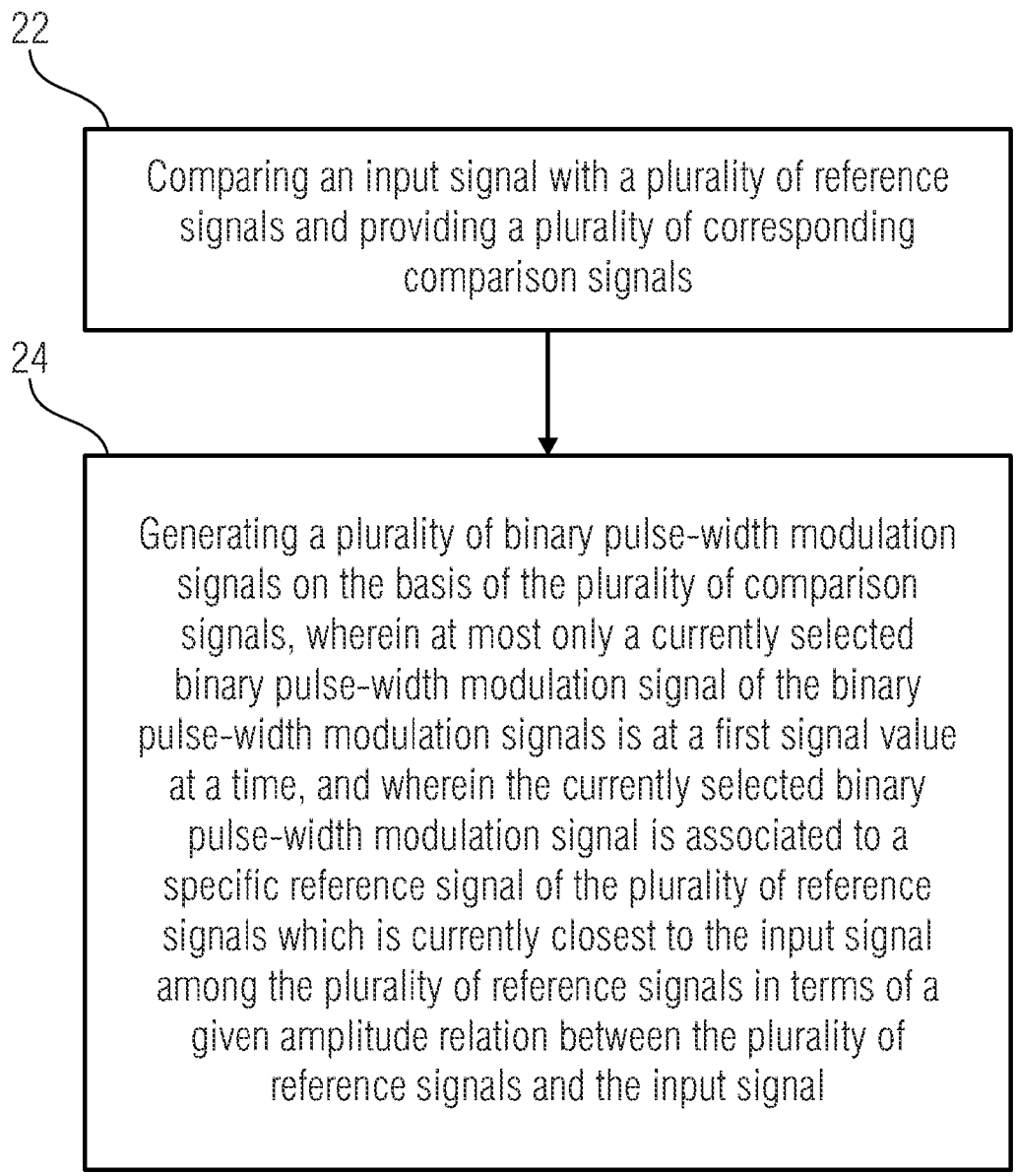
FIG. 20 shows a schematic flow diagram of a method for pulse-width modulation according to at least some embodiments of the teachings disclosed herein.

FIG. 20 shows a schematic flow diagram of a method for pulse-width modulation according to the teachings disclosed herein. The method comprises an action or step 22 of comparing an input signal with a plurality of reference signals. A plurality of corresponding comparison signals is provided which indicate how the input signal relates to each one of the plurality of reference signals, for example with respect of an amplitude.

In further embodiments of the disclosed teachings, a pulse-width modulation transmitter comprises a means for generating a plurality of disjoint pulse-width modulation signals on the basis of an input signal of the pulse-width modulation transmitter, the disjoint pulse-width modulation signals indicating an instantaneous amplitude range of an instantaneous amplitude of the input signal. The pulse-width modulation transmitter further comprises a plurality of means for amplifying. Each element of the means for amplifying is configured to receive a corresponding pulse-width modulation signal of the plurality of disjoint pulse-width modulation signals so that at most one of the plurality of switch mode amplifiers is active at a time.

The method for pulse-width modulation schematically illustrated in FIG. 20 further comprises an action or step 24 during which a plurality of (binary) pulse-width modulation signals are generated on the basis of the plurality of comparison signals. At most only a currently selected (binary) pulse-width modulation signal of the (binary) pulse-width modulation signals is at a first signal value at a time. The currently selected pulse-width modulation signal is (typically per definition or beforehand) associated to a specific reference signal out of the plurality of reference signals. The specific reference signals is the one reference signal which is closest to the input signal among the plurality of reference signals in terms of a given amplitude relation between the plurality of reference signals and the input signal.

The plurality of reference signals may have amplitude ranges that are disjoint.

According to the method an amplitude threshold (or more amplitude thresholds) may be varied which indicates a boundary between a first amplitude range and a second amplitude range of a first reference signal and a second reference signal, respectively, of the plurality of reference signals. In this manner, the plurality of reference signals may be dynamically adapted to a probability density function of the input signal so that an information content may be more evenly distributed among the different pulse-width modulation signals. The variation of the threshold(s) may be controlled by a unit that evaluates the probability density function of the input signal, for example. Another option would be to adjust the threshold(s) as a function of the mobile communication standard (UMTS, LTE, WCDMA, etc) that is currently used. Besides the amplitude thresholds the power supply conditions of one or more amplifiers may be varied, the amplifiers being controlled by one of the plurality of pulse-width modulation signals, respectively.

The method may further comprise an action of generating the plurality of reference signals so that the reference signals are periodically varying.

The plurality of reference signals may be ordered according to a hierarchy. A pulse-width modulation signal of the first hierarchy level may be forced to a second signal value if a comparison value of a (next or immediately next) higher hierarchy level is at the first signal value.

Figure 21:
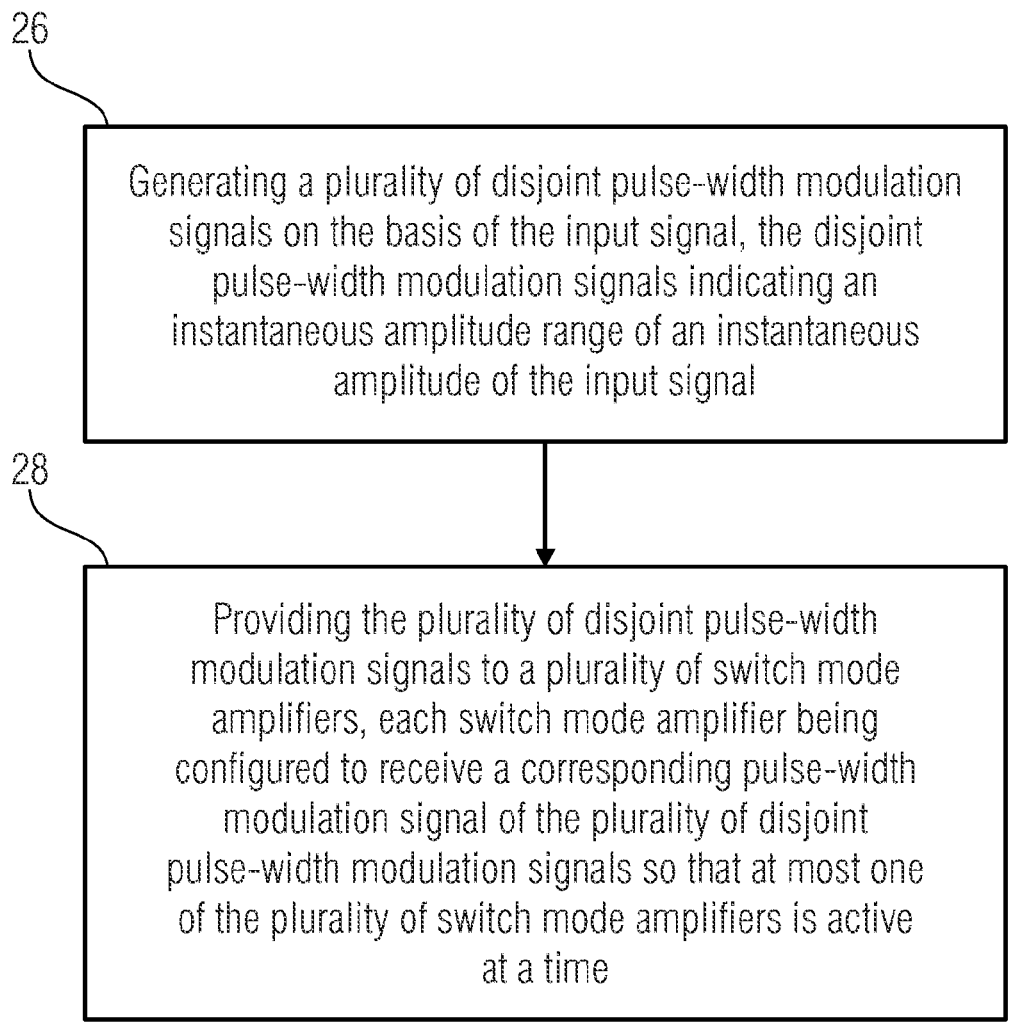
FIG. 21 shows a schematic flow diagram of a method for transmitting a signal according to at least some embodiments of the disclosed teachings.

FIG. 21 shows a schematic flow diagram of a method for transmitting an input signal. The method comprises an action or step 26 of generating a plurality of disjoint pulse-width modulation signals on the basis of the input signal. The disjoint pulse-width modulation signals indicate an instantaneous amplitude range of an instantaneous amplitude of the input signal. Furthermore, the method comprises an action or step 28 in which the plurality of disjoint pulse-width modulation signals are provided to a plurality of switch mode amplifiers. Each switch mode amplifier is configured to receive a corresponding pulse-width modulation signal of the plurality of the disjoint pulse-width modulation signals so that at most one of the plurality of switch mode amplifiers is active at a time.

Although some aspects have been described in the context of an apparatus, it is clear that these aspects also represent a description of the corresponding method, where a block or device corresponds to a method step or a feature of a method step. Analogously, aspects described in the context of a method step also represent a description of a corresponding block or item or feature of a corresponding apparatus. Some or all of the method steps may be executed by (or using) a hardware apparatus, like for example, a microprocessor, a programmable computer or an electronic circuit. In some embodiments, some one or more of the most important method steps may be executed by such an apparatus.

What is claimed is:

1. A pulse-width modulator comprising
a plurality of comparators for comparing an input signal with a plurality of reference signals and for providing a plurality of corresponding comparison signals; and
a combinational logic for receiving the plurality of comparison signals and for generating a plurality of binary pulse-width modulation signals on the basis of the plurality of comparison signals, wherein at most only a currently selected binary pulse-width modulation signal of the binary pulse-width modulation signals is at a first signal level at a time, and wherein the currently selected binary pulse-width modulation signal is associated to a specific reference signal of the plurality of reference signals which is currently closest to the input signal among the plurality of reference signals in terms of a given amplitude relation between the plurality of reference signals and the input signal.

2. The pulse-width modulator according to claim 1, wherein the plurality of reference signals have amplitude ranges that are disjoint.

3. The pulse-width modulator according to claim 1, wherein the plurality of reference signals are periodically varying.

4. The pulse-width modulator according to claim 1, wherein the given amplitude relation between the plurality of reference signals and the input signal is one of a greater-than relation, a greater-than-or-equal relation, a less-than relation, and a less-than-or-equal relation.

5. The pulse-width modulator according to claim 1, wherein the plurality of reference signals are ordered according to a hierarchy and wherein the combinational logic comprises at least one pulse-width modulation signal modifier for conditionally forcing a binary pulse-width modulation signal of a first hierarchy level to a second signal value if a comparison signal of a higher hierarchy level is at the first signal value.

6. The pulse-width modulator according to claim 1, wherein the combinational logic comprises at least one of a NOR gate and a subtractor.

7. The pulse-width modulator according to claim 6, wherein the plurality of reference signals are ordered according to a hierarchy, and wherein a first input and a second input of the NOR gate or the subtractor are connected to outputs of a first and second comparator of adjacent hierarchy levels, respectively.

8. The pulse-width modulator according to claim 1, further comprising a parallel output interface for providing the plurality of binary pulse-width modulation signals as control signals to a plurality of differently biased switch mode amplifiers.

9. An amplifier arrangement for amplifying an input signal, the amplifier arrangement comprising:
a first switch mode amplifier;
a second switch mode amplifier;
a first power supply for the first switch mode amplifier;
a second power supply for the second switch mode amplifier producing a different power supply condition than the first power supply; and
a pulse-width modulator for generating control signals for the first switch mode amplifier and the second switch mode amplifier on the basis of the input signal, the control signals being disjoint signals.

10. The amplifier arrangement according to claim 9, wherein at most one of the control signals is at a first signal value at a time, the first signal value activating the corresponding one of the first switch mode amplifier and the second switch mode amplifier so that at most one of the first switch mode amplifier and the second switch mode amplifier is active at a time.

11. The amplifier arrangement according to claim 9, wherein the first switch mode amplifier and the second switch mode amplifier are differently dimensioned.

12. The amplifier arrangement according to claim 9, wherein the pulse-width modulator comprises
a plurality of comparators for comparing the input signal with a plurality of reference signals and for providing a plurality of corresponding comparison signals; and
a combinational logic for receiving the plurality of comparison signals and for generating the control signals on the basis of the plurality of comparison signals, wherein a currently selected control signal is associated to a specific reference signal of the plurality of reference signals which is currently closest to the input signal among the plurality of reference signals in terms of a given amplitude relation between the plurality of reference signals and the input signal.

13. The amplifier arrangement according to claim 9, wherein the first switch mode amplifier and the second switch mode amplifier form or belong to a scaled amplifier bank.

14. The amplifier arrangement according to claim 9, wherein outputs of the first switch mode amplifier and of the second switch mode amplifier are directly connected to a common output node of the amplifier arrangement.

15. A pulse-width modulation transmitter comprising:
a multi-level pulse-width modulator for generating a plurality of disjoint pulse-width modulation signals on the basis of an input signal of the pulse-width modulation transmitter, the disjoint pulse-width modulation signals indicating an instantaneous amplitude range of an instantaneous amplitude of the input signal; and
a plurality of switch mode amplifiers, each switch mode amplifier being configured to receive a corresponding pulse-width modulation signal of the plurality of disjoint pulse-width modulation signals as a control signal to be amplified so that at most one of the plurality of switch mode amplifiers is active at a time.

16. The pulse-width modulation transmitter according to claim 15, wherein outputs of the switch mode amplifiers are directly connected to a common output node or to a common output circuit of the pulse-width modulation transmitter.

17. The pulse-width modulation transmitter according to claim 15, further comprising a plurality of frequency converters, each frequency converter being configured to shift the corresponding pulse-width modulation signal and to provide the corresponding frequency-shifted pulse-width modulation signal to the corresponding switch mode amplifier.

18. The pulse-width modulation transmitter according to claim 15, wherein at least two of the plurality of switch mode amplifiers are dimensioned differently.

19. The pulse-width modulation transmitter according to claim 15, wherein at least two of the plurality of switch mode amplifiers are supplied with electrical power with different power supply conditions.

20. The pulse-width modulation transmitter according to claim 15, further comprising
a directional coupler, a first port of which being connected to outputs of the plurality of switch mode amplifiers; and
a filter connected to a second port of the directional coupler, the filter being configured for filtering or reflecting out-of-band signal components back to the directional coupler and for passing through in-band signal components.

21. A method for pulse-width modulation, the method comprising:
comparing an input signal with a plurality of reference signals and providing a plurality of corresponding comparison signals; and
generating a plurality of binary pulse-width modulation signals on the basis of the plurality of comparison signals, wherein at most only a currently selected binary pulse-width modulation signal of the binary pulse-width modulation signals is at a first signal value at a time, and wherein the currently selected binary pulse-width modulation signal is associated to a specific reference signal of the plurality of reference signals which is currently closest to the input signal among the plurality of reference signals in terms of a given amplitude relation between the plurality of reference signals and the input signal.

22. The method according to claim 21, wherein the plurality of reference signals have amplitude ranges that are disjoint.

23. The method according to claim 22, further comprising:
varying an amplitude threshold indicating a boundary between a first amplitude range and a second amplitude range of a first reference signal and a second reference signal, respectively, of the plurality reference signals.

24. The method according to claim 21, further comprising generating the plurality of reference signals so that the plurality of reference signals are periodically varying.

25. The method according to claim 23, wherein the plurality of reference signals are ordered according to a hierarchy and wherein the method further comprises:
forcing a binary pulse-width modulation signal of the first hierarchy level to a second signal value if a comparison value of a higher hierarchy level is at the first signal value.

26. A method for transmitting an input signal, the method comprising:
generating a plurality of disjoint pulse-width modulation signals on the basis of the input signal, the disjoint pulse-width modulation signals indicating an instantaneous amplitude range of an instantaneous amplitude of the input signal; and
providing the plurality of disjoint pulse-width modulation signals to a plurality of switch mode amplifiers, each switch mode amplifier being configured to receive a corresponding pulse-width modulation signal of the plurality of disjoint pulse-width modulation signals as a control signal to be amplified so that at most one of the plurality of switch mode amplifiers is active at a time.

* * * * *